(12) United States Patent
Horning

(10) Patent No.: US 8,748,206 B2
(45) Date of Patent: Jun. 10, 2014

(54) SYSTEMS AND METHODS FOR A FOUR-LAYER CHIP-SCALE MEMS DEVICE

(75) Inventor: Robert D. Horning, Savage, MN (US)

(73) Assignee: Honeywell International Inc., Morristown, NJ (US)

( * ) Notice: Subject to any disclaimer, the term of this patent is extended or adjusted under 35 U.S.C. 154(b) by 344 days.

(21) Appl. No.: 13/295,273

(22) Filed: Nov. 14, 2011

(65) Prior Publication Data

US 2012/0126348 A1    May 24, 2012

Related U.S. Application Data

(60) Provisional application No. 61/416,485, filed on Nov. 23, 2010.

(51) Int. Cl.
    *H01L 21/00*    (2006.01)
(52) U.S. Cl.
    USPC ............... 438/51; 257/417; 257/E29.324
(58) Field of Classification Search
    CPC ........ H01L 21/54; H01L 23/564; H01L 23/26
    USPC ............ 257/417, E29.324; 438/50, 51, 458
    See application file for complete search history.

(56) References Cited

U.S. PATENT DOCUMENTS

| | | | |
|---|---|---|---|
| 5,397,747 A | | 3/1995 | Angiulli et al. |
| 5,497,660 A | | 3/1996 | Warren |
| 5,786,744 A | * | 7/1998 | Nishio et al. .......... 338/14 |
| 5,880,011 A | | 3/1999 | Zablotny et al. |
| 5,892,153 A | | 4/1999 | Weinberg et al. |
| 5,914,553 A | | 6/1999 | Adams et al. |
| 5,952,574 A | | 9/1999 | Weinberg et al. |
| 5,969,848 A | | 10/1999 | Lee et al. |
| 5,986,381 A | | 11/1999 | Hoen et al. |
| 6,000,280 A | | 12/1999 | Miller et al. |
| 6,181,050 B1 | | 1/2001 | Taussig et al. |

(Continued)

FOREIGN PATENT DOCUMENTS

EP    1998371    3/2008

OTHER PUBLICATIONS

Leib, Jurgen et al, "Novel Hermetic Wafer-Level-Packaging Technology Using Low-Temperature Passivation", "2005 Electronic Components and Technology Conference", 2005, pp. 562-565, Publisher: IEEE.

(Continued)

*Primary Examiner* — William F Kraig
*Assistant Examiner* — Joseph C Nicely
(74) *Attorney, Agent, or Firm* — Fogg & Powers LLC

(57) ABSTRACT

Systems and methods for a micro-electromechanical system (MEMS) apparatus are provided. In one embodiment, a system comprises a first double chip that includes a first base layer; a first device layer bonded to the first base layer, the first device layer comprising a first set of MEMS devices; and a first top layer bonded to the first device layer, wherein the first set of MEMS devices is hermetically isolated. The system also comprises a second double chip that includes a second base layer; a second device layer bonded to the second base layer, the second device layer comprising a second set of MEMS devices; and a second top layer bonded to the second device layer, wherein the second set of MEMS devices is hermetically isolated, wherein a first top surface of the first top layer is bonded to a second top surface of the second top layer.

20 Claims, 8 Drawing Sheets

(56) References Cited

U.S. PATENT DOCUMENTS

| | | | |
|---|---|---|---|
| 6,391,673 B1 * | 5/2002 | Ha et al. | 438/51 |
| 6,481,284 B2 | 11/2002 | Geen et al. | |
| 6,489,670 B1 * | 12/2002 | Peterson et al. | 257/686 |
| 6,612,029 B2 | 9/2003 | Behin et al. | |
| 6,725,719 B2 | 4/2004 | Cardarelli | |
| 6,743,696 B2 | 6/2004 | Jeung et al. | |
| 6,744,173 B2 | 6/2004 | Behin et al. | |
| 6,744,174 B2 | 6/2004 | Paden et al. | |
| 6,757,092 B2 | 6/2004 | Abu-Ageel | |
| 6,792,804 B2 | 9/2004 | Adams et al. | |
| 6,845,668 B2 | 1/2005 | Kim et al. | |
| 6,853,067 B1 | 2/2005 | Cohn et al. | |
| 6,865,944 B2 | 3/2005 | Glenn et al. | |
| 6,868,726 B2 | 3/2005 | Lemkin et al. | |
| 6,949,807 B2 | 9/2005 | Eskridge et al. | |
| 7,004,025 B2 * | 2/2006 | Tamura | 73/511 |
| 7,036,373 B2 | 5/2006 | Johnson et al. | |
| 7,040,922 B2 * | 5/2006 | Harney et al. | 439/527 |
| 7,074,636 B2 | 7/2006 | Curtis et al. | |
| 7,104,129 B2 * | 9/2006 | Nasiri et al. | 73/514.29 |
| 7,258,010 B2 | 8/2007 | Horning et al. | |
| 7,258,011 B2 * | 8/2007 | Nasiri et al. | 73/514.32 |
| 7,357,874 B2 | 4/2008 | Moffat et al. | |
| 7,444,868 B2 | 11/2008 | Johnson | |
| 7,469,588 B2 | 12/2008 | LaFond et al. | |
| 7,504,757 B2 | 3/2009 | Subramanian et al. | |
| 7,526,402 B2 | 4/2009 | Tanenhaus et al. | |
| 7,527,997 B2 | 5/2009 | Xu et al. | |
| 7,585,750 B2 | 9/2009 | Do et al. | |
| 7,690,254 B2 | 4/2010 | Pilchowski et al. | |
| 7,700,410 B2 | 4/2010 | Bernstein et al. | |
| 7,741,156 B2 | 6/2010 | Pagaila et al. | |
| 7,776,655 B2 | 8/2010 | Do et al. | |
| 7,818,871 B2 | 10/2010 | Shcheglov | |
| 7,820,484 B2 | 10/2010 | Chua et al. | |
| 7,849,742 B2 | 12/2010 | Wang et al. | |
| 7,872,394 B1 | 1/2011 | Gritters et al. | |
| 7,932,570 B1 | 4/2011 | Eskridge | |
| 7,984,648 B2 | 7/2011 | Horning et al. | |
| 8,011,247 B2 | 9/2011 | Glenn | |
| 8,047,075 B2 * | 11/2011 | Nasiri et al. | 73/514.32 |
| 8,187,902 B2 | 5/2012 | Weinberg et al. | |
| 8,250,921 B2 * | 8/2012 | Nasiri et al. | 73/511 |
| 8,508,039 B1 * | 8/2013 | Nasiri et al. | 257/704 |
| 8,549,922 B2 | 10/2013 | Kalnitsky et al. | |
| 2002/0109133 A1 | 8/2002 | Hikita et al. | |
| 2003/0005767 A1 * | 1/2003 | Hulsing, II | 73/514.02 |
| 2003/0085438 A1 | 5/2003 | Habibi et al. | |
| 2003/0106372 A1 | 6/2003 | Adams et al. | |
| 2003/0183008 A1 | 10/2003 | Bang et al. | |
| 2003/0196490 A1 * | 10/2003 | Cardarelli | 73/504.02 |
| 2004/0221451 A1 * | 11/2004 | Chia et al. | 29/854 |
| 2005/0023629 A1 * | 2/2005 | Ding et al. | 257/414 |
| 2005/0170656 A1 * | 8/2005 | Nasiri et al. | 438/700 |
| 2005/0218488 A1 | 10/2005 | Matsuo | |
| 2005/0284222 A1 | 12/2005 | Johnson et al. | |
| 2006/0063462 A1 * | 3/2006 | Ding et al. | 445/25 |
| 2006/0179942 A1 | 8/2006 | Fukaura et al. | |
| 2006/0219006 A1 * | 10/2006 | Nasiri et al. | 73/504.12 |
| 2007/0090475 A1 * | 4/2007 | Karnick et al. | 257/415 |
| 2007/0096295 A1 | 5/2007 | Burtzlaff et al. | |
| 2007/0114643 A1 | 5/2007 | DCamp et al. | |
| 2007/0158807 A1 | 7/2007 | Lu et al. | |
| 2008/0049386 A1 * | 2/2008 | Pornin et al. | 361/679 |
| 2008/0115579 A1 * | 5/2008 | Seeger et al. | 73/504.12 |
| 2009/0001565 A1 * | 1/2009 | Takemoto et al. | 257/729 |
| 2009/0065907 A1 | 3/2009 | Haba et al. | |
| 2009/0294914 A1 | 12/2009 | Pagaila et al. | |
| 2009/0309203 A1 | 12/2009 | Seppala et al. | |
| 2010/0072626 A1 | 3/2010 | Theuss et al. | |
| 2010/0123241 A1 | 5/2010 | Shi et al. | |
| 2010/0251818 A1 * | 10/2010 | Ge et al. | 73/504.12 |
| 2010/0270668 A1 | 10/2010 | Marcoux | |
| 2010/0320595 A1 * | 12/2010 | Horning et al. | 257/698 |
| 2011/0163955 A1 * | 7/2011 | Nasiri et al. | 345/158 |
| 2011/0227173 A1 * | 9/2011 | Seppala et al. | 257/415 |
| 2012/0112293 A1 * | 5/2012 | Pornin et al. | 257/415 |
| 2012/0126349 A1 | 5/2012 | Horning et al. | |
| 2012/0126350 A1 | 5/2012 | Horning | |
| 2012/0126881 A1 | 5/2012 | Horning et al. | |
| 2012/0130672 A1 | 5/2012 | Horning et al. | |
| 2013/0087933 A1 * | 4/2013 | Pornin et al. | 257/789 |

OTHER PUBLICATIONS

Leib et al, "New Wafer-Level-Packaging Technology using Silicon-Via-Contacts for Optical and Other Sensor Applications", "2004 Electronic Components and Technology Conference", Jun. 1, 2004, pp. 843-847, vol. 1, Publisher: IEEE.

European Patent Office, "Office Action", "from Foreign Counterpart of U.S. Appl. No. 13/299,576", Apr. 11, 2012, pp. 1-5, Published in: EP.

European Patent Office, "European Search Report", "from Foreign Counterpart of U.S. Appl. No. 13/299,576", Mar. 1, 2012, pp. 1-3, Published in: EP.

U.S Patent and Trademark Office, "Office Action", "from U.S. Appl. No. 13/299,576", Mar. 18, 2013, pp. 1-20, Published in: US.

U.S Patent and Trademark Office, "Office Action", "from U.S. Appl. No. 13/301,145", Oct. 29, 2013, pp. 1-18, Published in: US.

Molfese et al, "Analysis, testing and optimisation of electrostatic comb-drive levitational actuators", "Analog Integr Circ Sig Process", Dec. 22, 2005, pp. 33-40, No. 48, Publisher: Springer Science+Business Media, LLC, Published in: Pisa, Italy.

Painter et al, "Effect of Levitation Forces on the Performance of Surface Micromachined MEMS Gyroscopes", Oct. 24, 2004, pp. 508-511, vol. 1, Publisher: IEEE.

Tang et al, "Electrostatic Comb Drive Levitation and Control Method", "Journal of Microelectromechanical Systems", Dec. 1992, pp. 170-178, vol. 1, No. 4, Publisher: IEEE.

Tang et al, "Electrostatically Balanced Comb Drive for Controlled Levitation", "Solid-State Sensor and Actuator Workshop 4th Technical Digest", Jun. 1990, pp. 23-27, Publisher: IEEE.

Timpe et al., "Levitation compensation method for dynamic electrostatic comb-drive actuators", "Science Direct Sensors and Actuators A.", Feb. 7, 2008, pp. 383-389, No. 143, Publisher: Elsevier.

European Patent Office, "Communication under Rule 71(3) from EP Application No. 11190203.7 mailed Feb. 18, 2014", "from Foreign Counterpart of U.S. Appl. No. 13/296,642", Feb. 18, 2014, pp. 1-7, Published in: EP.

U.S. Patent and Trademark Office, "Final Office Action", "From U.S. Appl. No. 13/301,145", Feb. 24, 2014, pp. 1-7, Published in: US.

European Patent Office, "European Search Report", "from Foreign Counterpart of U.S. Appl. No. 13/295,273", Dec. 4, 2013, pp. 1-3, Published in: EP.

European Patent Office, "European Search Report", "from Foreign Counterpart of U.S. Appl. No. 13/296,642", Dec. 4, 2013, pp. 1-3, Published in: EP.

* cited by examiner

SYSTEMS AND METHODS FOR A FOUR-LAYER CHIP-SCALE MEMS DEVICE

CROSS REFERENCE TO RELATED APPLICATIONS

This application claims the benefit of priority to U.S. Provisional Application No. 61/416,485, filed on Nov. 23, 2010, the disclosure of which is incorporated herein by reference.

BACKGROUND

Inertial measurement units (IMUs) can acquire motion information for determining navigational information like position, heading, and attitude. For example, IMUs are used in high performance applications such as vehicle or air plane navigation, and lower performance applications such as aircraft attitude and heading recognition, personal navigation, or missile guidance. In some applications that incorporate IMUs there is limited space for the placement of an IMU. As a typical IMU provides motion information by using three gyroscopes, three accelerometers, and supporting electrodes and electrical interconnects, it is challenging to integrate an IMU into applications with limited space while maintaining desired performance.

SUMMARY

The embodiments of the present invention provide systems and methods for a four-layer chip scale MEMS device and will be understood by reading and studying the following specification.

Systems and methods for a micro-electromechanical system (MEMS) apparatus are provided. In one embodiment, a system includes a first double chip that includes a first base layer; a first device layer bonded to the first base layer, the first device layer including a first set of MEMS devices; and a first top layer bonded to the first device layer, wherein the first set of MEMS devices is hermetically isolated. The system also includes a second double chip that includes a second base layer; a second device layer bonded to the second base layer, the second device layer including a second set of MEMS devices; and a second top layer bonded to the second device layer, wherein the second set of MEMS devices is hermetically isolated, wherein a first top surface of the first top layer is bonded to a second top surface of the second top layer.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
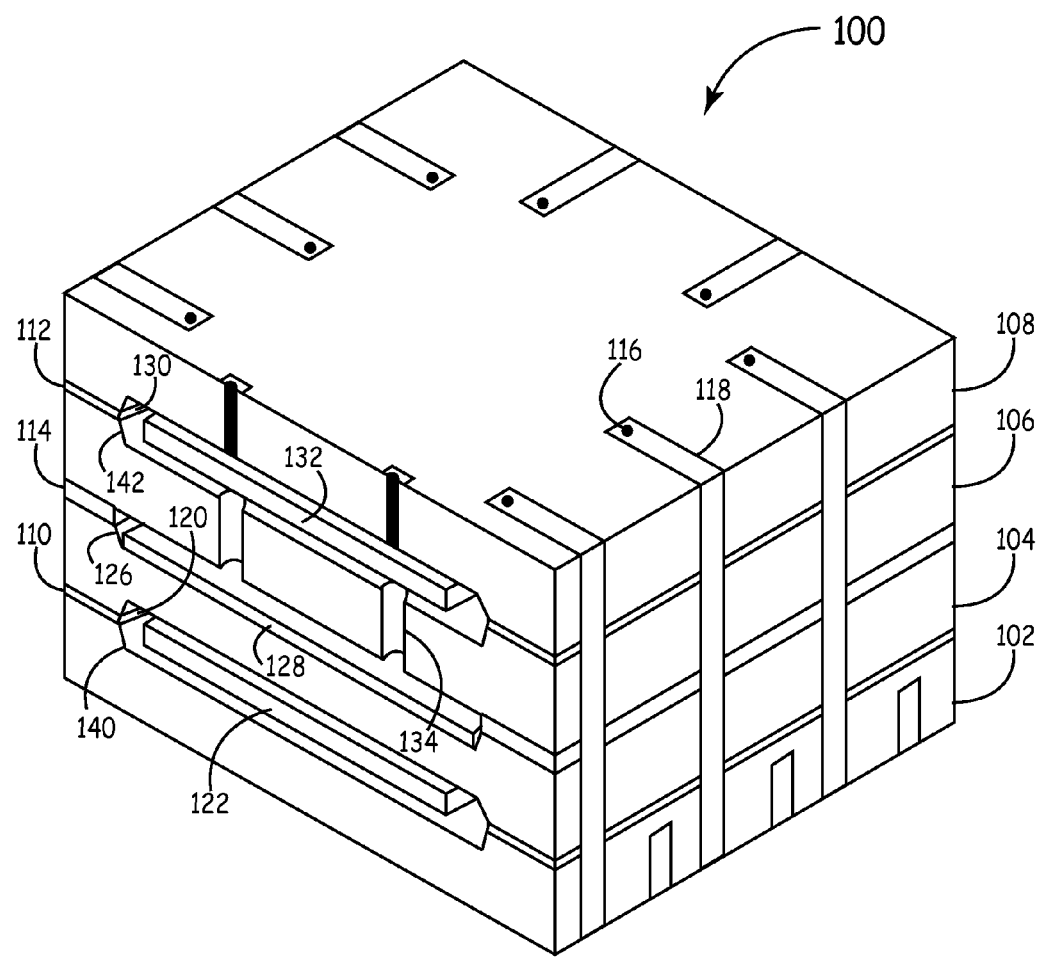
FIG. 1 is a perspective cross-sectional view of a four-layer chip scale MEMS device according to one embodiment.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing Figures and the specification is not to be construed as limiting the order in which the individual steps may be performed. The following detailed description is, therefore, not to be taken in a limiting sense.

Embodiments of the present disclosure provide systems and methods for fabricating a small IMU that preserves high performance. To consolidate the multiple components and electronics of an IMU, micro-electromechanical systems (MEMS) gyroscopes and accelerometers are sealed between different pairs of supportive glass wafers. The glass wafers are then stacked on top of and bonded to one another. The placement between glass wafers and subsequent stacking upon one another allows for the reduction of volume occupied by the IMU while preserving the desired IMU performance.

FIG. 1 is a cut away diagram of one embodiment of a four-layer chip scale MEMS system 100. MEMS system 100 includes four-layers organized into two double chips that are assembled on top of one another that enclose multiple MEMS devices. For example, MEMS system 100 includes a first double chip having a first base layer 102 and a first top layer 104 that encloses a first MEMS device layer 110, and a second double chip having a second top layer 106 and a second base layer 108 that encloses a second MEMS device layer 112. The positioning of the first double chip and the second double chip on top of one another, while enclosing the MEMS devices, creates a smaller area, thicker device. This reduces flexing of MEMS system 100. The reduction in flexing can increase the performance of MEMS devices that are susceptible to errors induced by external shocks and vibrations. To further reduce flexing, first base layer 102, first top layer 104, second top layer 106, and second base layer 108 can be made from a rigid material such as glass, or other rigid nonconductive material.

Further, first base layer 102, first top layer 104, second top layer 106, and second base layer 108 include recesses 140, 142 and support electrodes and electrical interconnects to support the operation of MEMS devices 122 and 132. For example, the inward facing surface of first base layer 102 has recess 140 and electrical connections to provide space for the first device layer 110 and the inward facing surface of second base layer 108 contains recess 142 and electrical connections to support the operation of second device layer 112. Likewise, the inward facing surfaces of both first top layer 104 and second top layer 106 include recesses, electrodes and electrical interconnections that mirror the electrodes, electrical interconnection and recesses 140, 142 of both first base layer 102 and second base layer 108 to provide space for the operation of first device layer 110 and second device layer 112.

In certain embodiments, the MEMS devices are part of an inertial sensor assembly (ISA) that functions in an inertial measurement unit (IMU). When the devices are part of an ISA, MEMS system 100 includes accelerometers and gyroscopes to sense rotation and acceleration of MEMS system 100. In some implementations, MEMS system 100 includes three accelerometers that sense acceleration along three orthogonal axes and three gyroscopes that sense rotation about three orthogonal axes. Thus, first device layer 110 and second device layer 112, when combined, contain three accelerometers and three gyroscopes. Thus, MEMS devices 122 in first device layer 110 include a first set of gyroscopes and a first set of accelerometers and MEMS devices 132 in second device layer 112 includes a second set of gyroscopes and a second set of accelerometers.

To function correctly, some MEMS devices are designed to operate in particular atmosphere types. For example, some MEMS gyroscopes are designed to operate in a vacuum atmosphere type while some MEMS accelerometers are designed to operate in a gaseous atmosphere type. Because the device layers can contain different MEMS devices that operate in different atmosphere types, the devices can be hermetically isolated from one another within a device layer. In an alternative implementation, a device layer contains only a single type of sensor. For example, as shown in FIG. 1, first device layer 110 contains MEMS devices 122 where MEMS devices 122 are designed to operate in the presence of gas and second device layer 112 contains MEMS devices 132 where MEMS devices 132 are designed to operate within a vacuum. To preserve the atmosphere types within recesses 140 and 142, hermetic seals 120 and 130 seal recesses 140 and 142 from the atmosphere type of the external environment of the MEMS system 100. Hermetic seals 120 and 130 are fabricated using anodic bonding of a silicon ring around MEMS devices 122 and 132. Alternatively, hermetic seals 120 and 130 are formed using a solder or a eutectic seal ring.

In at least one embodiment, MEMS system 100 includes a getter 128 to preserve a vacuum environment for at least a portion of the MEMS devices 122 in first device layer 110 and MEMS devices 132 in second device layer 112. In some implementations, getter 128 is located in recesses 140 and 142 in either of first base layer 102, first top layer 104, second top layer 106, and second base layer 108 where the getter is in a continuous vacuum cavity with the gyroscopes in MEMS system 100 and other MEMS devices that require a vacuum to operate correctly. In an alternative embodiment, a channel 134 is located in either first top layer 104 or second top layer 106 or both, such that channel 134 forms a continuous vacuum cavity enclosing the first and second set of gyroscopes. Further, either first top layer 104, or second top layer 106 includes a getter recess 126, which includes a getter 128 exposed to the air cavity enclosing the first and second set of gyroscopes.

In certain embodiments, MEMS system 100 includes multiple vias 116 that extend through first base layer 102 and second base layer 108 to electrically connect to the electrical connections supporting the operation of MEMS devices 122 and 132. In one implementation, vias 116 are electrically conductive silicon posts formed in first and second base layers 102 and 108. Alternatively, vias 116 are metal posts deposited within channels formed in first and second base layers 102 and 108 through micro-abrasion or drilling. Further, interconnects 118 are formed along the exterior of the device to connect vias 116 to external electrical connections for mounting MEMS system 100 on a PCB board or other mounting surface. The interconnects connect to vias 116 around the exterior surface of the device 100 such that the device can be mounted in multiple orientations. In an alternative embodiment, the interconnects connect to vias 116 located on the external surface of the first and second device layer so as to allow electrical connections with the first and second MEMS devices 122 and 132 without extending through the first base layer 102 and second base layer 108.

An ISA formed as described above in relation to MEMS system 100 provides an ISA that is both small and robust for three reasons. First, seals 120 and 130 used to isolate MEMS devices 122 and 132 from the external environment and each other are positioned above each other, thus decreasing the area that is jointly occupied by the seals on a die. Second, getter 128 is deposited in an unused recess 126 rather than in recesses 140 and 142, where recesses having getters would be larger to achieve sufficient gettering capacity and due to the larger recesses, MEMS system 100 would be larger. Third, the individual layers can each be made thinner without sacrificing chip stiffness because of the small ratio of area to thickness makes the stacked ISA a much stiffer chip and less sensitive to performance-degrading strains and temperature variations.

Figure 2A:
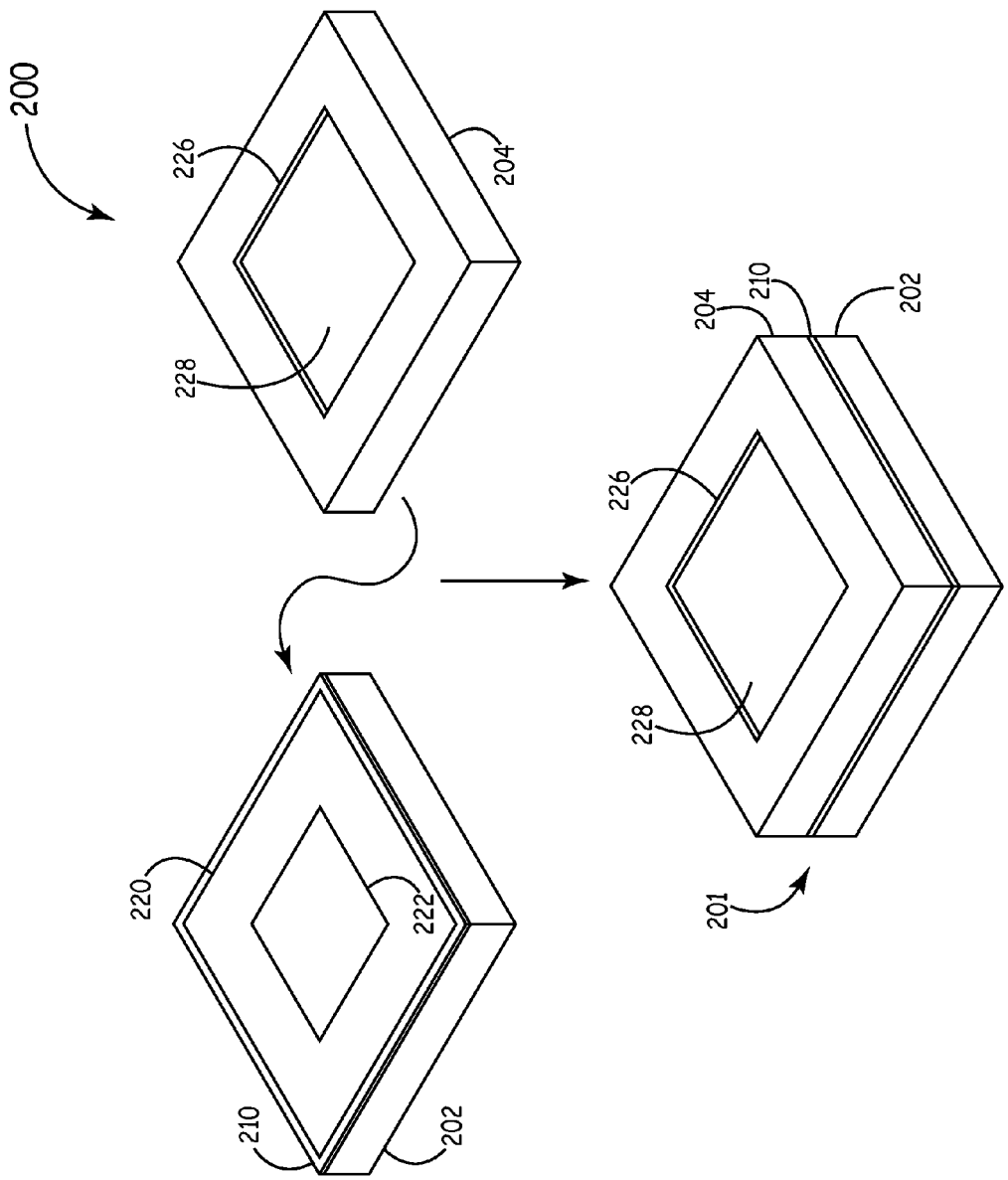
FIGS. 2A-2C are perspective views illustrating the fabrication of a four-layer chip scale MEMS device according to one embodiment.
Figure 2B:
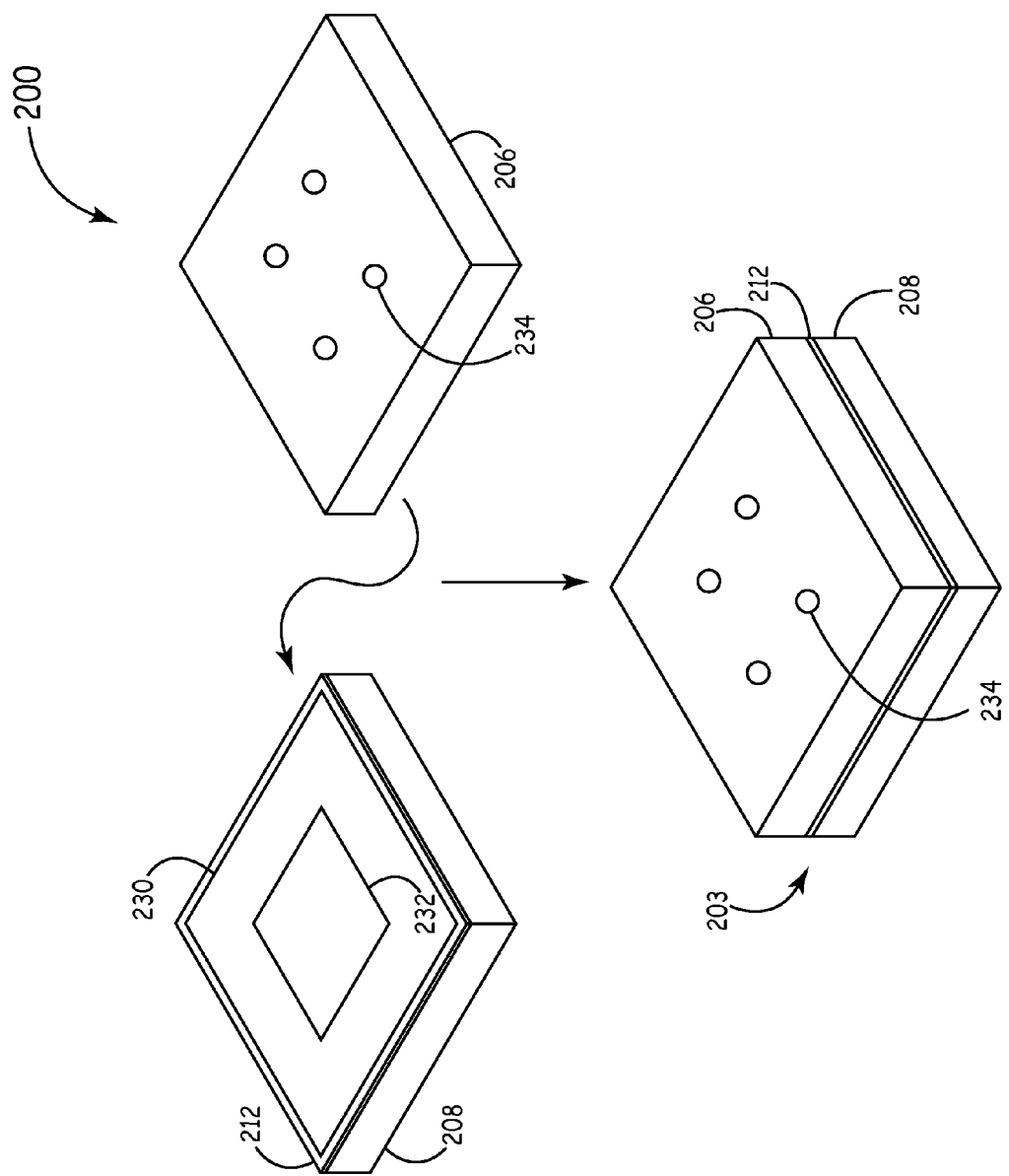
Figure 2C:
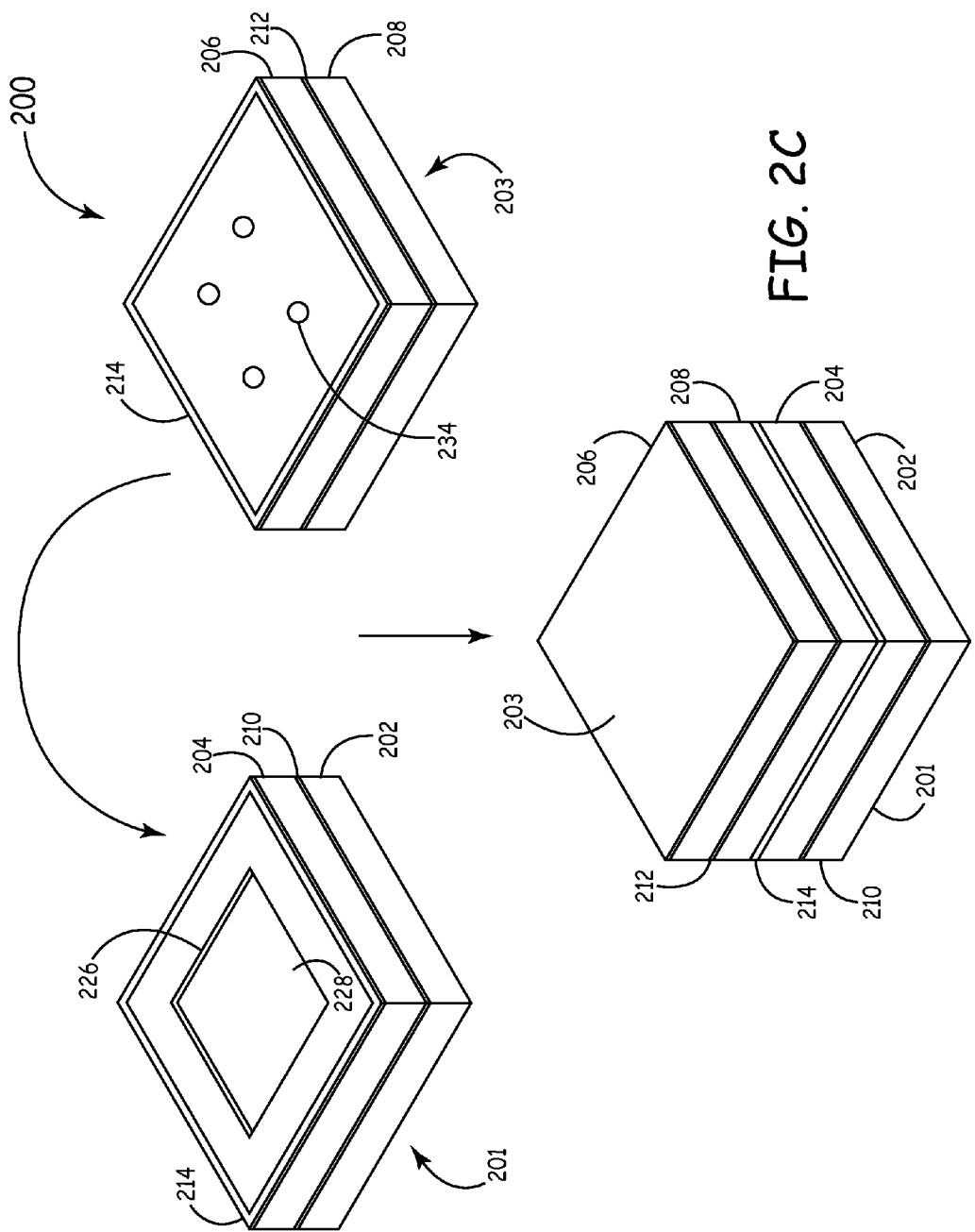

FIGS. 2A-2C are diagrams illustrating one embodiment of a fabrication process 200 for making a four-layer chip scale MEMS device where one device layer is sealed in a gaseous atmosphere type and another device layer is sealed in a vacuum. FIG. 2A illustrates one embodiment of the fabrication process 200 for making first double chip 201 where first double chip 201 seals the first device layer in a gaseous atmosphere type. First double chip 201 includes a first base layer 202 and a first top layer 204. When forming first base layer 202 and first top layer 204, fabrication process 200 forms recesses in the first base layer 202 and the first top layer 204 as shown by recess 142 in FIG. 1. Further electrical connections are patterned and deposited on first base layer 202 and first top layer 204 where the electrical connections support the operation of MEMS devices. In certain embodiments, first base layer 202 and first top layer 204 are fabricated from glass or another rigid non-conductive material. In a further embodiment, the first base layer 202 is preformed to have conductive silicon posts connected to the electrodes and electrical interconnects to extend electrical connections from the MEMS device 232 to the external surface of the MEMS system.

In certain embodiments, fabrication process 200 forms a first device layer 210. First device layer 210 is similar to first device layer 110 in FIG. 1 and process 200 forms first device layer 210 using normal MEMS processes. For example, process 200 deposits an epitaxial layer on a supportive silicon wafer. Process 200 then patterns the first device layer 210 into and through the epitaxial layer, where the first device layer 210 includes a seal 220 and MEMS device 222. When the epitaxial layer is patterned, process 200 bonds the epitaxial layer containing the first device layer 210 to first base layer 202. In some implementations, the first base layer 202 is bonded to the epitaxial layer containing first device layer 210 using anodic bonding. When the epitaxial layer is bonded to the first outer layer 202, process 200 removes the supportive silicon wafer from the epitaxial layer. When the supportive silicon wafer is removed, the MEMS devices in first device layer 210 are free to move and are secured to first base layer 202.

When fabrication process 200 bonds first device layer 210 to first base layer 202, process 200 bonds first top layer 204 to first device layer 210. In one implementation, process 200 performs the bonding of first top layer 204 to first device layer 210 in a gaseous environment. When the bonding of first top layer 204 to first device layer 210 is performed in a gaseous environment, process 200 bonds both first bottom layer 202 and first top layer 204 to seal 220 of first device layer 210. Seal 220 hermetically maintains the gaseous atmosphere type enclosed within first double chip 201 that surrounds MEMS devices 222. For example, when MEMS devices 222 includes accelerometers, the accelerometers are sealed in gas to dampen the motion of the accelerometer. In an alternative implementation, when MEMS device 222 is a gyroscope, MEMS device 222 is sealed in a vacuum.

In some embodiments, when first top layer 204 is bonded to first base layer 202, the process 200 forms a getter 228 on the top surface of first top layer 204. As first double chip 201 will be bonded to a second double chip 203 that seals devices within a vacuum, a getter 228 positioned on the top surface of first top layer 204 preserves the vacuum in second double chip 203 without impacting the size of the MEMS system while preserving the desired gettering capacity. For example, process 200 forms a getter recess 226 within the top surface of first top layer 204 and deposits a getter material within getter recess 226 to form getter 228. In some implementations, the getter material is a thin film getter and includes material such as Titanium, Zinc, and Zirconium alloys. The getter material absorbs gas that comes into contact with the surface of getter 228. For example, the getter material of getter 228 absorbs gas that comes into contact with the getter material that is found around the MEMS device in second double chip 203.

FIG. 2B illustrates one embodiment of the fabrication of second double chip 203 by fabrication process 200. Second double chip 203 includes a second base layer 208 and a second top layer 206. When forming second base layer 208 and second top layer 206, recesses are formed in second base layer 208 and second top layer 206 as shown by recess 142 in FIG. 1. Further, process 200 patterns and deposits electrodes and electrical interconnects on second base layer 208 and second top layer 206 where the electrical connections support the operation of MEMS devices. In certain embodiments, second base layer 208 and second top layer 206 are fabricated from glass or another rigid non-conductive material. In a further embodiment, second base layer 208 is preformed to have conductive silicon posts connected to the electrical connections to extend the electrical connections from MEMS device 232 to the external surface of the MEMS system.

In certain implementations, process 200 forms a second device layer 212. Second device layer 212 is similar to second device layer 112 in FIG. 1 and second device layer 212 is formed using normal MEMS processes. For example, process 200 deposits an epitaxial layer on a supportive silicon wafer. Process 200 then patterns second device layer 212 into and through the epitaxial layer, where second device layer 212 includes a seal 230 and MEMS device 232. When the epitaxial layer is patterned, process 200 bonds the epitaxial layer containing second device layer 212 to second base layer 208. In some implementations, process 200 bonds second base layer 208 to the epitaxial layer containing second device layer 212 using anodic bonding. When the epitaxial layer is bonded to second base layer 208, process 200 removes the supportive silicon wafer from the epitaxial layer. When the supportive silicon wafer is removed, the MEMS devices in second device layer 212 are free to move and are secured to second base layer 208.

When fabrication process 200 bonds second device layer 212 to second base layer 208, process 200 bonds second top layer 206 to second device layer 212. In one implementation, process 200 bonds second top layer 206 to second device layer 212 in a gaseous environment. In an alternative implementation, process 200 bonds second top layer 206 to second device layer 212 in a vacuum. When the bonding of second top layer 206 to second device layer 212 is performed in a vacuum, process 200 bonds both second bottom layer 208 and second top layer 206 to seal 230 of second device layer 212. Seal 230 hermetically maintains the vacuum enclosed within second double chip 203 that surrounds MEMS devices 232. For example, when MEMS devices 232 includes gyroscopes, the gyroscopes are sealed in a vacuum to prevent air from interfering with the sensing of rotation.

In some implementations, process 200 further preserves and maintains a vacuum by providing access to a getter through second top layer 206. As was described previously, process 200 forms a getter on the top surface of first top layer 204. Process 200 provides access to this getter through a series of channels 234 formed in second top layer 206. When process 200 bonds second top layer 206 to second device layer 212, the recessed area shown in FIG. 1 as recess 142 and the channels 234 form a continuous vacuum cavity within second double chip 203. Thus, a getter 228 in FIG. 2B sealed within the continuous vacuum cavity containing MEMS device 232 maintains the vacuum within second double chip 203.

FIG. 2C illustrates one embodiment of the fabrication of the four-layer chip scale MEMS device by joining first double chip 201 to second double chip 203. When first double chip 201 and second double chip 203 are formed, fabrication process 200 forms the four-layer chip-scale MEMS device by joining first double chip 201 to second double chip 203. In one embodiment, second double chip 203 is flipped over and stacked on top of first double chip 201 such that first top layer 204 of first double chip 201 is proximate to second top layer 206 of second double chip 203. For example, when the top surface of first top layer 204 includes a getter 228 and the top surface of second top layer 206 includes a series of channels 234, second double chip 203 is placed on top of first double chip 201 such that channels 234 face getter 228.

In certain embodiments, the region where first double chip 201 contacts second double chip 203 is hermetically sealed to prevent air from entering into or exiting from within either first device layer 210 or second device layer 212. Further, first double chip 201 is bonded to second double chip 203 in a vacuum environment. For example, when either first double chip 201 or second double chip 203 contain a gyroscope or other MEMS device that requires a vacuum environment to operate correctly, getter material may be deposited between the first and second double chips 201 and 203 to maintain the vacuum in either first device layer 210 or second device layer 212. To form the hermetic seal 214, process 200 places frit or solder around the edge of the joined first and second double chips 201 and 203, places first and second double chips 201 and 203 on top of one another, and heats the solder or frit until it flows and joins first and second double chips 201 and 203 to one another. During the joining of first and second double chips 201 and 203, the heating of the solder or frit also heats and activates getter 228, when getter 228 is activated, the air coating the top surface of getter 228 is mixed into the getter material such that the top surface of getter 228 is renewed and ready to absorb gas molecules present within the device layer that forms a continuous air cavity exposed to getter 228. Thus, process 200 fabricates the MEMS system by joining first double chip 201 to second double chip 203.

In some implementations, the fabrication of the device is performed on large wafers. As such, the process to create the MEMS system creates large batches of MEMS devices that are joined together. To make individual devices, the large wafers are singulated into the individual devices.

Figure 3A:
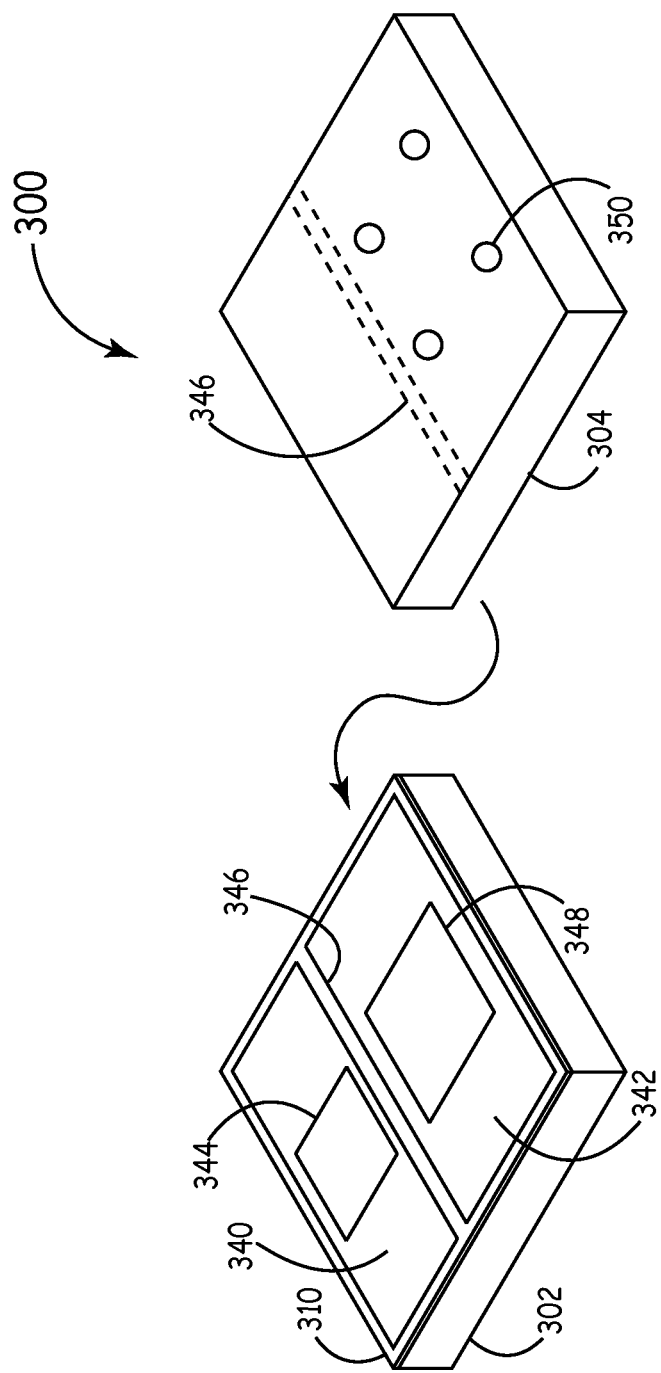
FIG. 3A-3B are perspective views illustrating the fabrication of a four-layer chip scale MEMS device according to one embodiment.
Figure 3B:
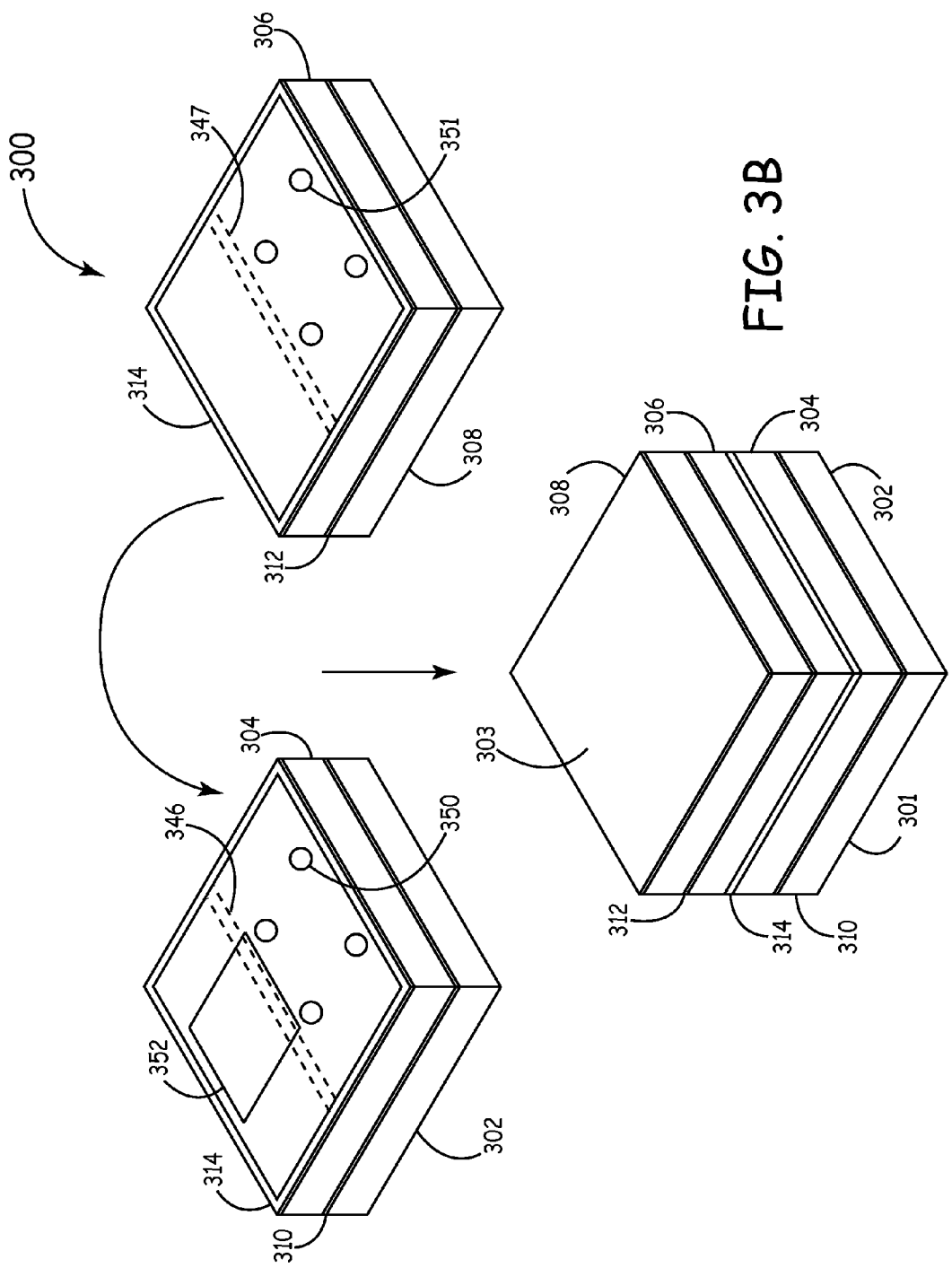

FIGS. 3A-3B are diagrams illustrating a fabrication process 300 for a four-layer chip scale MEMS device according to one embodiment. FIG. 3A illustrates the formation of a double chip that includes components sealed in a vacuum and components sealed in gas. For example, first device layer 310 contains both a gyroscope and an accelerometer, where the gyroscope is sealed in a vacuum and the accelerometer is sealed in an air filled environment. To create the different sealed regions, two different device compartments are formed in device layer 310. For example, device layer includes a gas compartment 340 and a vacuum compartment 342. In gas compartment 340, device layer 310 includes a MEMS device 344 designed to operate in a gaseous environment and in vacuum compartment 342, device layer 310 includes a MEMS device 348 designed to operate in a vacuum. To separate gas compartment 340 from vacuum compartment 342, device layer 310 includes a separation wall 346. Separation wall 346 hermetically isolates gas compartment 340 from vacuum compartment 342. When first bottom layer 302 is anodically bonded to first device layer 310, first bottom layer 302 is also anodically bonded to separation wall 346. Also, when first top layer 304 is anodically bonded to first device layer 310, first top layer 304 is also anodically bonded to separation wall 346.

In certain embodiments, to provide access to a getter, fabrication process 300 creates channels in first top layer 304 that correspond with the location of the vacuum compartment 342. The channels allow a getter to absorb gas within a cavity, when the getter is placed between a first double chip and a second double chip.

FIG. 3B illustrates the joining of two double chips to form a four-layer MEMS system. For example, a first double chip 301 and a second double chip 303 are fabricated as described in relation to FIG. 3A. Fabrication process 300 forms getter 352 by depositing getter material on either the top surface of first top layer 304 or the top surface of second top layer 306, or both. As both first device layer 310 and second device layer 312 contain both gas compartments and vacuum compartments, the channels 350 and 351 are located to form a continuous vacuum cavity that includes the vacuum compartments in both first device layer 310 and second device layer 312 and exposes the continuous vacuum cavity to getter 352. Further, the joining of first double chip 301 to second double chip 303 is similar to the joining of first double chip 201 to second double chip 203 as explained in relation to FIG. 2C.

FIG. 4A-4D are diagrams illustrating different mounting configurations of a four-layer MEMS device according to one embodiment. For example, in some embodiments, when the fabrication process has constructed MEMS system 400, interconnects are formed along the exterior of the device to allow the device to be mounted on a PCB or other mounting substrate. In one embodiment, vias extend from the electrical components within system 400 to connect to the interconnects. The interconnects connect the vias around the exterior surface of system 400 such that system 400 can be mounted in multiple orientations. In some implementations, the vias are an electrically conductive silicon that is formed in the glass layers to electrically connect the vias to the metal films deposited on the glass layers. Alternatively, the vias are metal posts deposited within channels formed in the glass layer through microabrasion or drilling.

Figure 4B:
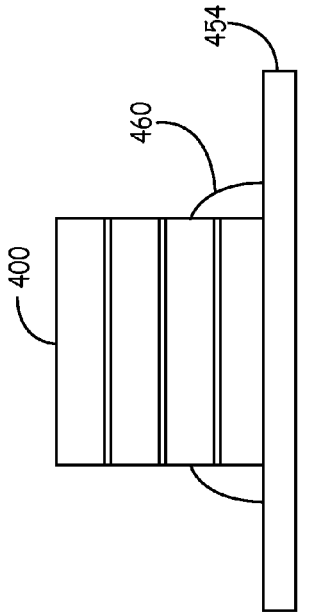
FIGS. 4A-4D are cross-sectional views illustrating different embodiments of mounting configurations of a four-layer MEMS device.
Figure 4D:
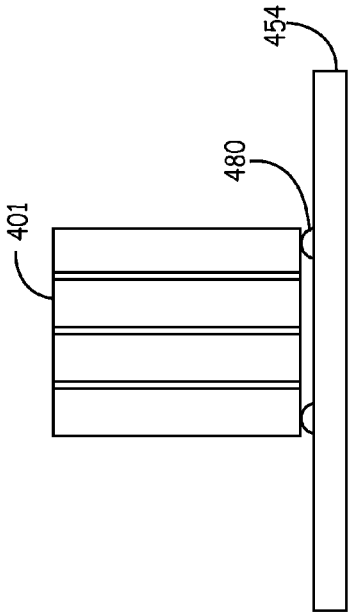
Figure 4A:
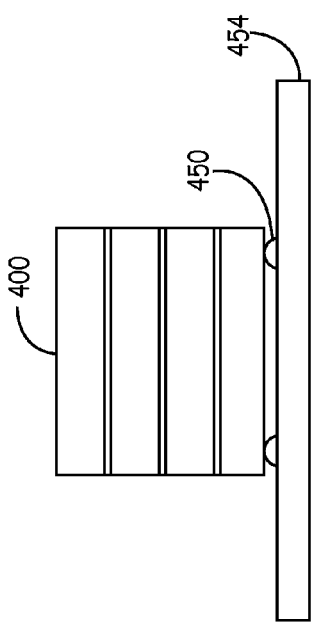

FIG. 4A illustrates a MEMS system 400 mounted on a board 454, where MEMS system 400 is electrically connected to board 454 through bump bonds 450 coupled to electrical interconnects on the outer surface of MEMS system 400. For example, the interconnects on MEMS system 400 extend electrical connections from vias around the outer surface of MEMS system 400. In some implementations, the electrical interconnects extend to the side of MEMS system 400 that contacts the top surface of board 454. To connect to the top surface of board 454, bump bonds 450 provide an electrical connection between the interconnects and board 454.

FIG. 4B illustrates a MEMS system 400 mounted on a board 454, where MEMS system 400 is electrically connected to board 454 through wire bonds 460 coupled to interconnects on the side of MEMS system 400. For example, when the interconnects are on the sides of MEMS system 400, wire bonds extend from board 454 to electrically connect to interconnects located on the sides of MEMS system 400.

Figure 4C:
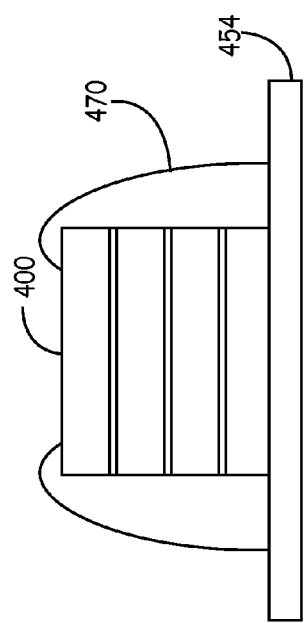

FIG. 4C illustrates a MEMS system 400 mounted on a board 454, where MEMS system 400 is electrically connected to board 454 through wire bonds coupled to electrical contacts on the top surface of MEMS system 400. For example, when the interconnects are on the top surface of MEMS system 400, wire bonds extend from board 454 to electrically connect to interconnects located on the top surface of MEMS system 400.

FIG. 4D illustrates a MEMS system 401 mounted on a board 454, where MEMS system 401 is electrically connected to board 454 through bump bonds 480 coupled to electrical interconnects on a side of the outer surface of MEMS system 401. For example, the interconnects on MEMS system 401 extend electrical connections from vias around the outer surface of MEMS system 401. In some implementations, the electrical interconnects extend to a side of MEMS system 401 that is oriented perpendicularly to the orientation of the layers in MEMS system 401. To connect to the top surface of board 454, bump bonds 480 provide an electrical connection between the interconnects and board 454.

Figure 5:
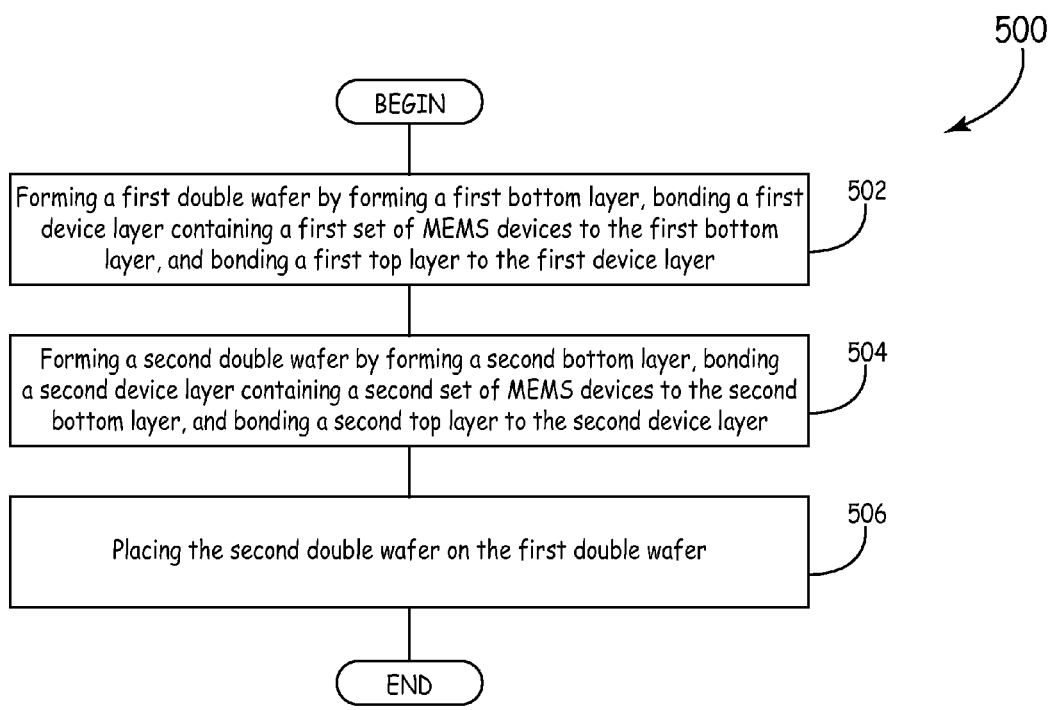
FIG. 5 is a flow diagram of an example method for constructing a four-layer MEMS device according to one embodiment.

FIG. 5 is a flow diagram of an example method 500 for constructing a four-layer MEMS device according to one embodiment. Method 500 begins at block 502 with forming a first double chip by forming a first base layer, bonding a first device layer containing a first set of MEMS devices to the first base layer, and bonding a first top layer to the first device layer. In certain embodiments, the first set of MEMS devices are hermetically sealed between the first base layer and the first top layer. Further, the MEMS devices include accelerometers and gyroscopes that function in different atmosphere types. For example, when the first set of MEMS devices are accelerometers, the first base layer and the first top layer hermetically seal the accelerometers within a gaseous atmosphere.

Method 500 proceeds at block 504 with forming a second double chip by forming a second base layer, bonding a second device layer containing a second set of MEMS devices to the second base layer, and bonding a second top layer to the second device layer. In certain embodiments, the second set of MEMS devices are hermetically sealed between the second base layer and the second top layer. For example, in some implementations, the second set of MEMS devices includes gyroscopes designed to operate within a vacuum. The hermetic sealing of the MEMS devices between the second base layer and the second top layer seal the gyroscope within a vacuum.

Method 500 further proceeds at block 506 with bonding the first top layer to the second top layer. For example, to fabricate a full ISA, the first device layer and second device layer include three gyroscopes that sense rotation about three orthogonal axes and three accelerometers that sense rotation along three orthogonal axes. Further, in at least one implementation, a getter is deposited between the first top layer and the second top layer to preserve the vacuum around MEMS devices that require a vacuum environment to operate correctly.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A micro-electromechanical system (MEMS) apparatus, the apparatus comprising:
a first double chip comprising:
a first base layer;
a first device layer bonded to the first base layer, the first device layer comprising a first set of MEMS devices; and
a first top layer bonded to the first device layer, wherein the first set of MEMS devices is hermetically isolated; and
a second double chip comprising:
a second base layer;
a second device layer bonded to the second base layer, the second device layer comprising a second set of MEMS devices; and
a second top layer bonded to the second device layer, wherein the second set of MEMS devices is hermetically isolated,
a getter, hermetically sealed between the first double chip and the second double chip, the getter configured to absorb air within the MEMS apparatus, the getter being exposed to air that circulates around at least one of the first set of MEMS devices and the second set of MEMS devices;
wherein a first top surface of the first top layer is bonded to a second top surface of the second top layer.

2. The apparatus of claim 1, wherein the first set of MEMS devices comprises a set of accelerometers, wherein the set of accelerometers senses acceleration along three orthogonal axes.

3. The apparatus of claim 2, wherein the set of accelerometers are hermetically sealed in a gaseous atmosphere type.

4. The apparatus of claim 1, wherein the second set of MEMS devices comprises a set of gyroscopes, wherein the set of gyroscopes senses rotation about three orthogonal axes.

5. The apparatus of claim 4, wherein the set of gyroscopes are hermetically sealed in a vacuum.

6. The apparatus of claim 5, further comprising a channel in the second top layer, wherein the channel allows gas to circulate between the getter and the second device layer.

7. The apparatus of claim 6, wherein the getter is located within a recess formed on the first top surface of the first top layer.

8. The apparatus of claim 1, wherein the first device layer includes a combination of gyroscopes and accelerometers.

9. The apparatus of claim 8, wherein the first device layer comprises a first sealed compartment and a second sealed compartment, wherein the first sealed compartment contains the gyroscopes hermetically sealed in a vacuum, and the second sealed compartment contains accelerometers hermetically sealed within a gaseous atmosphere type.

10. The apparatus of claim 9, further comprising a channel in the first top layer, wherein the channel allows gas to circulate between the getter and the first sealed compartment.

11. The apparatus of claim 1, further comprising vias that provide electrical connections between the first set of MEMS devices and the second set of MEMS devices and an external surface of the MEMS device.

12. The apparatus of claim 11, wherein the vias are formed using at least one of silicon and metal.

13. The apparatus of claim 11, wherein the vias are connected to interconnects, wherein the interconnects allow the first double chip and the second double chip to be electrically mounted on a surface in a plurality of positions.

14. A method for fabricating a micro-electromechanical system (MEMS) device, the method comprising:
forming a first double chip by forming a first base layer, bonding a first device layer containing a first set of MEMS devices to the first base layer, and bonding a first top layer to the first device layer, wherein the first set of MEMS devices are hermetically sealed between the first base layer and the first top layer;
forming a second double chip by forming a second base layer, bonding a second device layer containing a second set of MEMS devices to the second base layer, and bonding a second top layer to the second device layer, wherein the second set of MEMS devices are hermetically sealed between the second base layer and the second top layer; and
hermetically sealing a getter between the first double chip and the second double chip, the getter configured to absorb air within the MEMS device, the getter being exposed to air that circulates around at least one of the first set of MEMS devices and the second set of MEMS devices
bonding the first top layer to the second top layer.

15. The method of claim 14, wherein the first set of MEMS devices comprises a first combination of accelerometers and gyroscopes and the second set of MEMS devices comprises a second combination of accelerometers and gyroscopes, wherein accelerometers in the first combination of accelerometers and gyroscopes and in the second combination of accelerometers and gyroscopes sense acceleration along three orthogonal axes and gyroscopes in the first combination of accelerometers and gyroscopes and in the second combination of accelerometers and gyroscopes sense rotation about three orthogonal axes.

16. The method of claim 15, further comprising hermetically sealing the accelerometers in a gaseous atmosphere type.

17. The method of claim 15, further comprising hermetically sealing the gyroscopes in a vacuum.

18. The method of claim 14, further comprising:
forming a channel in at least one of the first top layer and the second top layer, wherein the channel allows gas to circulate between the getter and at least one of the first device layer and the second device layer.

19. The method of claim 14, further comprising:
forming a plurality of MEMS devices in a plurality of joined wafers; and
singulating the plurality of MEMS devices into individual MEMS devices.

20. An inertial measurement unit (IMU) device, the device comprising:
a first double chip comprising:
a first glass base layer;
a first semiconductor layer bonded to the first glass base layer, the first semiconductor layer comprising a first set of MEMS gyroscopes and MEMS accelerometers; and
a first glass top layer bonded to the first semiconductor layer; and
a second double chip comprising:
a second glass base layer;
a second semiconductor layer bonded to the second base layer, the second semiconductor layer comprising a second set of MEMS gyroscopes and MEMS accelerometers such that the combination of the first set of MEMS gyroscopes and MEMS accelerometers and the second set of MEMS gyroscopes and MEMS accelerometers provides measurements of acceleration along, and rotation about, three orthogonal axes; and a second glass top layer bonded to the second semiconductor layer;

a getter hermetically sealed between the first double chip and the second double chip, the getter configured to absorb air within the IMU device, the getter being exposed to air that circulates around at least one of the first semiconductor layer and the second semiconductor layer;

wherein the second glass top layer is bonded to the first glass top layer.

\* \* \* \* \*